(12) United States Patent
Moon (10) Patent No.: US 9,185,831 B2
(45) Date of Patent: Nov. 10, 2015

(54) ELECTRONIC CONTROL APPARATUS FOR VEHICLE USING RADIATION BOARD AND MANUFACTURING METHOD THEREOF

(71) Applicant: Hyundai Autron Co., Ltd., Seongnam-si (KR)

(72) Inventor: Hyung Joon Moon, Seoul (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 172 days.

(21) Appl. No.: 14/139,836

(22) Filed: Dec. 23, 2013

(65) Prior Publication Data
US 2015/0009629 A1  Jan. 8, 2015

(30) Foreign Application Priority Data
Jul. 5, 2013  (KR) ................. 10-2013-0078891

(51) Int. Cl.
*H05K 7/20* (2006.01)
*H05K 13/00* (2006.01)
(Continued)

(52) U.S. Cl.
CPC .............. *H05K 7/20854* (2013.01); *G06F 1/20* (2013.01); *H01L 21/44* (2013.01); *H05K 5/0034* (2013.01); *H05K 5/06* (2013.01); *H05K 5/065* (2013.01); *H05K 7/20* (2013.01); *H05K 13/00* (2013.01); *H05K 13/0023* (2013.01); *Y10T 29/49147* (2015.01)

(58) Field of Classification Search
CPC ..... H05K 7/20; H05K 3/284; H05K 7/20854; H05K 13/0023; H05K 5/0034; H05K 5/06; H05K 5/065; H05K 5/069; G06F 1/20; F02D 2400/18; H01L 21/44; B29C 47/92

USPC ........... 361/679.54, 704, 705, 707, 709, 710, 361/714, 715, 719, 722, 730, 732, 736, 737, 361/752; 257/706, 707, 711–713, 722–724, 257/678, 686, 687; 29/832, 840, 842, 29/846–852; 165/80.2, 80.3, 104.33, 185; 264/40.1, 40.5, 40.6; 438/106–124
See application file for complete search history.

(56) References Cited

U.S. PATENT DOCUMENTS 3,904,078 A * 9/1975 Neff et al. .................. 222/1
5,645,775 A * 7/1997 Spahr et al. ............... 264/40.5
(Continued)

FOREIGN PATENT DOCUMENTS

| EP | 01-855361 A | 9/2008 |
|---|---|---|
| JP | 06-125024 A | 5/1994 |
| JP | 10-065074 A | 3/1998 |

*Primary Examiner* — Michail V Datskovskiy
(74) *Attorney, Agent, or Firm* — Mayer Brown LLP; Hyunho Park (57) ABSTRACT

Disclosed are an electronic control apparatus for a vehicle and provides an electronic control apparatus for a vehicle using a radiation board in which a radiation plate having a slide fixing structure (for example, "U" shaped) is attached onto a portion opposite to a portion which requires the radiation in a printed circuit board (PCB) and if additional radiation performance is required, a slidable radiation board which is detachable is attached/detached to directly emit heat to the atmosphere through the radiation plate and the radiation board to the atmosphere, thereby improving a radiation effect and to implement a standard platform of the radiation structure and implement an optimal radiation structure through a slidable radiation board and a manufacturing method thereof.

11 Claims, 12 Drawing Sheets

(51) Int. Cl.
  *G06F 1/20* (2006.01)
  *H05K 5/06* (2006.01)
  *H01L 21/44* (2006.01)
  *H05K 5/00* (2006.01)

(56) References Cited

U.S. PATENT DOCUMENTS

| | | | |
|---|---|---|---|
| 5,774,342 A * | 6/1998 | Brandenburg et al. | 361/774 |
| 6,285,551 B1 * | 9/2001 | Brandenburg et al. | 361/704 |
| 6,291,880 B1 * | 9/2001 | Ogawa et al. | 257/723 |
| 6,350,631 B1 * | 2/2002 | Kobayashi et al. | 438/107 |
| 6,779,260 B1 * | 8/2004 | Brandenburg et al. | 29/841 |
| 7,134,194 B2 * | 11/2006 | Brandenburg et al. | 29/832 |
| 7,151,674 B2 * | 12/2006 | Sasaki et al. | 361/752 |
| 7,359,212 B2 * | 4/2008 | Mayuzumi et al. | 361/760 |
| 7,473,585 B2 * | 1/2009 | Brandenburg et al. | 438/124 |
| 7,576,991 B2 * | 8/2009 | Naritomi | 361/748 |
| 7,616,448 B2 * | 11/2009 | Degenkolb et al. | 361/752 |
| 7,924,572 B2 * | 4/2011 | Mayuzumi et al. | 361/753 |
| 8,093,692 B2 * | 1/2012 | Obara | 257/668 |
| 2002/0019072 A1 * | 2/2002 | Kobayashi et al. | 438/107 |
| 2006/0131771 A1 * | 6/2006 | McBain et al. | 264/40.1 |
| 2006/0272159 A1 * | 12/2006 | Rubin et al. | 30/162 |
| 2010/0201028 A1 * | 8/2010 | Yoo et al. | 264/259 |
| 2010/0300723 A1 | 12/2010 | Ambo et al. | |
| 2011/0210461 A1 * | 9/2011 | Kariya et al. | 264/40.6 |

* cited by examiner

ELECTRONIC CONTROL APPARATUS FOR VEHICLE USING RADIATION BOARD AND MANUFACTURING METHOD THEREOF

CROSS-REFERENCE TO RELATED APPLICATIONS

This application is based on and claims priority from Korean Patent Application No. 10-2013-0078891, filed on Jul. 5, 2013, with the Korean Intellectual Property Office, the disclosure of which is incorporated herein in its entirety by reference.

TECHNICAL FIELD

The present disclosure relates to an electronic control apparatus for a vehicle, and more particularly to an electronic control apparatus having a heat radiating and waterproof structure using a radiation board and an over-molding in an electronic control apparatus such as an engine electronic control unit (ECU) of a vehicle.

BACKGROUND ART

In general, an electronic control apparatus such as an ECU, which electronically controls various types of devices, is equipped in a vehicle. The electronic control apparatus receives information from sensors or switches that are installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The cover and the base are assembled together with the PCB while covering the PCB, and particularly, the connector, which is interposed between the cover and the base when the cover and the base are assembled, forms a sealing structure with the cover side and the base side.

The electronic control apparatus includes a high integrated control circuit means and thus requires a predetermined sealing structure that may prevent external moisture or foreign substances from flowing into the electronic control apparatus, and the electronic control apparatus mainly adopts a sealing structure in which the cover and the base are typically assembled together with the connector in a state in which sealing materials are inserted on binding parts between the cover and the base and the connector so as to protect the PCB and the like in the electronic control apparatus.

In the meantime, in the electronic control apparatus, heating elements are provided on a top side of the PCB, and a heat radiation paste is attached onto a bottom side of the PCB. The cover and the base are fastened by a screw. Here, the structure coupled by the screw method may become loose, and external contaminants or moisture may flow into the structure. In the electronic control apparatus in the related art, heat generated from the electronic components is discharged to the cover surrounding the PCB. To this end, the cover may include a part which may discharge heat. However, heat generated from the electronic components of the PCB is not directly discharged to the outside through the base made of a metal material, so that heat radiation performance may deteriorate.

SUMMARY

The present disclosure has been made in an effort to provide an electronic control apparatus for a vehicle using a radiation board in which a radiation plate having a slide fixing structure (for example, "U" shaped) is attached onto a portion opposite to a portion which requires the radiation in an electronic control element and if additional radiation performance is required, a slidable radiation board which is detachable is attached/detached to directly emit heat to the atmosphere through the radiation plate and the radiation board to the atmosphere, thereby improving radiation effect, and to implement a standard platform of the radiation structure and implement an optimal radiation structure through a slidable radiation board and a manufacturing method thereof.

The present disclosure has been made in an effort to provide an electronic control apparatus for a vehicle using a radiation board which overmolds a portion other than a portion onto which a "U" shaped radiation plate is attached so that a housing is formed of a mold resin after attaching the radiation plate in advance, which may provide a simple manufacturing process and an electronic control element is enclosed by a mold resin to have excellent waterproof function, and a manufacturing method thereof.

A first aspect of the present disclosure provides an electronic control apparatus for a vehicle including a printed circuit board (PCB) which includes an electronic control substrate which electrically controls each part of a vehicle and electronic components installed on one surface of the electronic control substrate; a radiation plate which is attached onto another surface which is opposite to the one surface on which the electronic components is located among the other surfaces of the electronic control substrate in order to radiate heat of the electronic components and has a slide fixing structure; a radiation board which has at least one radiation pin formed on one surface thereof and is slidably attached/detached onto/from the slide fixing structure of the radiation plate; a connector which includes a connector pin and is coupled to the PCB; and an overmold housing which overmolds the PCB onto which the radiation plate is attached using a mold resin and overmolds the remaining portion other than another surface onto which the radiation plate is attached among the other surfaces of the electronic control substrate.

The radiation plate may have an an outer corner having a "U" shaped slide fixing structure so as to slidably fit the radiation board therein.

When an additional radiation structure is required other than the radiation using the radiation plate, the radiation board has various types of radiation pins according to the additional radiation structure.

The radiation board may include at least one radiation pin having an interval between radiation pins or the number of radiation pins according to the additional radiation structure on another surface which is opposite to the one surface on which the electronic components is located, among the other surfaces of the electronic control substrate.

The overmold housing may overmold a portion other than the radiation plate among the other surfaces of the PCB and encloses an outer corner of the radiation plate except for the slide fixing structure of the radiation plate.

The radiation plate may be a metal material or pad type plate.

The overmold housing may be injection-molded while being maintained at below predetermined failure threshold temperature and pressure of the electronic control substrate or the electronic components.

A second aspect of the present disclosure provides a manufacturing method of an electronic control apparatus, comprising: coupling a printed circuit board (PCB) which includes an electronic control substrate which electrically controls each part of a vehicle and electronic components installed on a surface of the electronic control substrate with a connector which includes a connector pin; attaching a radiation plate having a slide fixing structure onto another surface which is opposite to the one surface on which the electronic components is located among the other surfaces of the electronic control substrate; overmolding by inserting the PCB onto which the radiation plate is attached in upper and lower molds in which the remaining portion other than another surface on which the radiation plate is attached, is overmolded among the other surfaces of the electronic control substrate and injecting the mold resin therein; and attaching and/or detaching slidably the radiation board which has at least one radiation pin formed on one surface thereof onto and/or from the slide fixing structure of the radiation plate.

In the attaching/detaching, when the slide fixing structure of the radiation plate has a "U" shape, the radiation board is slidably attached and/or detached onto the "U" shaped slide fixing structure.

In the overmolding, a portion other than the radiation plate among the other surfaces of the electronic control substrate is overmolded by injecting the mold resin so as to encloses an outer corner of the radiation plate except for the slide fixing structure of the radiation plate.

In the overmolding, the PCB onto which the radiation plate is attached is injection-molded while maintaining the inside of the mold to be at below predetermined failure threshold temperature and pressure of the electronic control substrate or the electronic components.

According to the exemplary embodiments of the present disclosure, the heat which is generated from the electronic components is directly discharged to the atmosphere through a radiation plate and a radiation board which are attached onto a PCB so that heat radiation effect is excellent. Specifically, according to the exemplary embodiments of the present disclosure, the radiation plate is overmolded so as to enclose only outer corners of the radiation plate using the mold resin. Therefore, it is possible to directly discharge heat which is generated from the electronic components to the atmosphere through the radiation plate which is not enclosed by the mold resin.

According to the exemplary embodiments of the present disclosure, when it is required to add an additional radiation structure to the radiation plate having a "U" shaped slide fixing structure, a slidable radiation board which is detachable is attached and detached so that it is possible to easily manufacture the radiation board in which various radiation pins are formed in an electronic control apparatus for a vehicle.

According to the exemplary embodiments of the present disclosure, a "U" shaped radiation plate is used to implement a standard platform of a radiation structure, so that it is possible to easily implement an optimal radiation structure in accordance with the position of the electronic components or a caloric value.

According to the exemplary embodiments of the present disclosure, the radiation plate is attached in advance, and then an electronic control element to which a radiation plate is attached is inserted in a mold to form a housing using a mold resin so that it is possible to simplify a manufacturing process of the electronic control apparatus.

According to the exemplary embodiments of the present disclosure, the electronic control element which includes electronic components and a PCB and a connector are enclosed by a mold resin, so that a waterproof function is excellent.

According to the exemplary embodiments of the present disclosure, the housing is formed of an overmold housing so that the electronic control apparatus may be lighter than other housing.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION OF THE EMBODIMENTS

In the following detailed description, reference is made to the accompanying drawing, which form a part hereof. The illustrative embodiments described in the detailed description, drawing, and claims are not meant to be limiting. Other exemplary embodiments may be utilized, and other changes may be made, without departing from the spirit or scope of the subject matter presented here.

Hereinafter, exemplary embodiments of the present disclosure will be described in detail with reference to the accompanying drawings. A configuration of the present disclosure and an effect thereof will be clearly understood through the following detailed description. Prior to detailed description, like reference numerals designate like elements throughout the specification even though illustrated in different drawings. It is noted that a detailed explanation of known constitutions may be omitted when it is determined that the detailed explanation obscures the subject matter of the present disclosure.

Figure 1A:
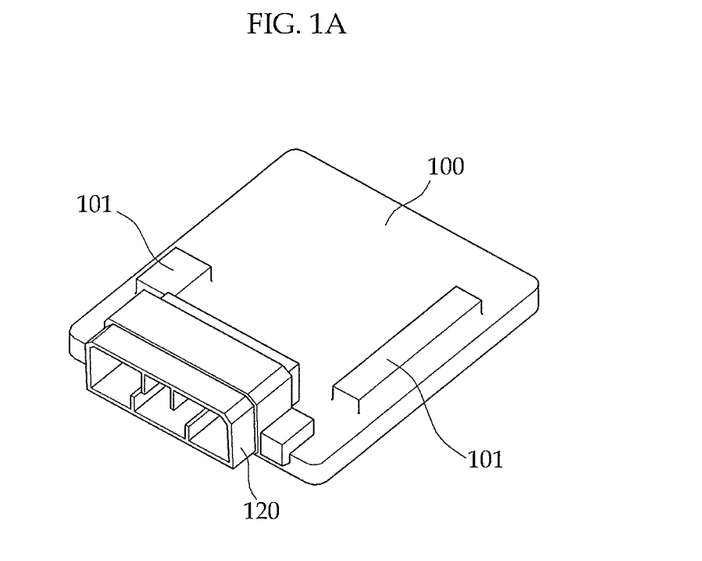
FIGS. 1A to 1D are combined perspective views illustrating an electronic control apparatus for a vehicle according to an exemplary embodiment of the present disclosure.
Figure 1B:
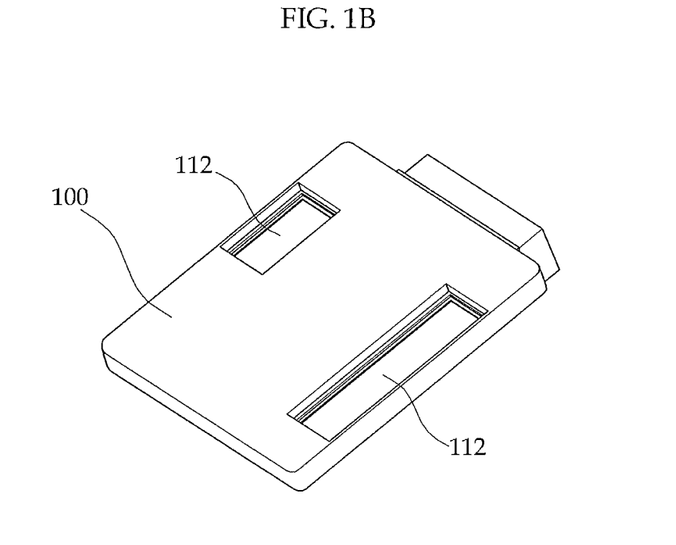
Figure 1C:
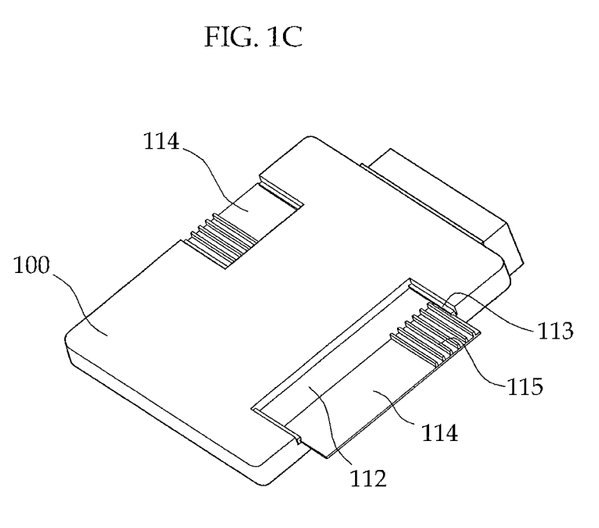
Figure 1D:
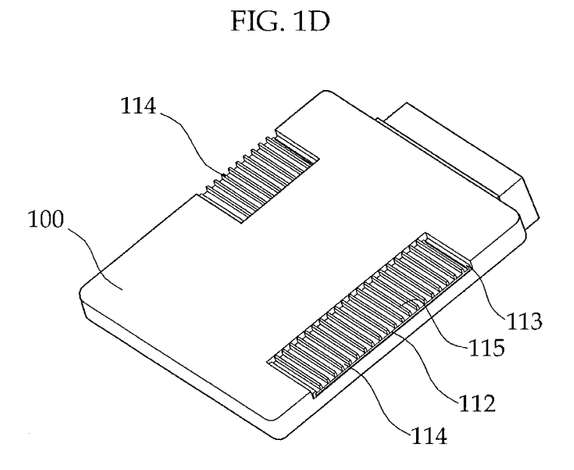
Figure 2A:
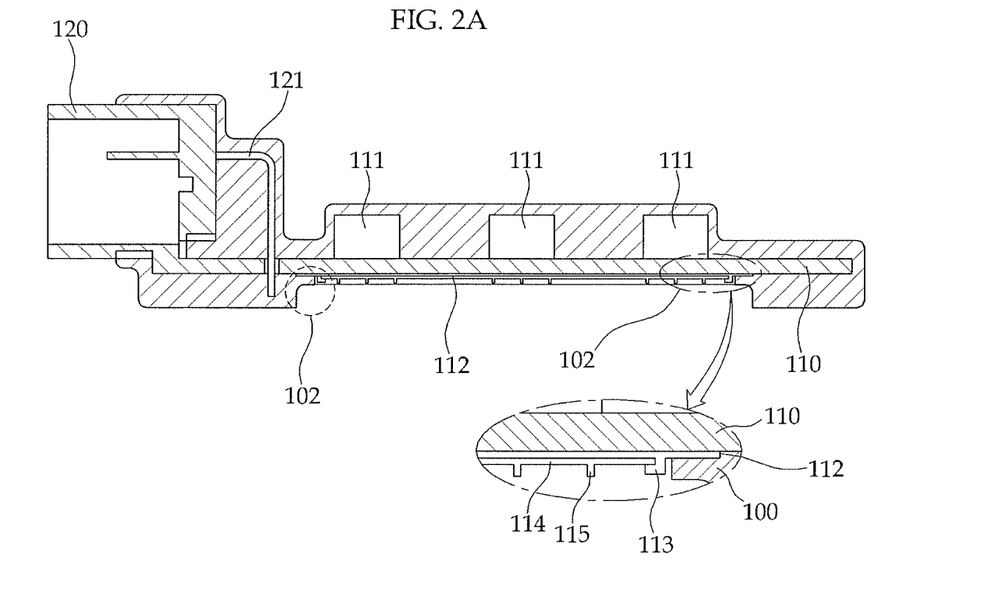
FIGS. 2A and 2B are cross-sectional perspective views illustrating an electronic control apparatus for a vehicle according to an exemplary embodiment of the present disclosure.
Figure 2B:
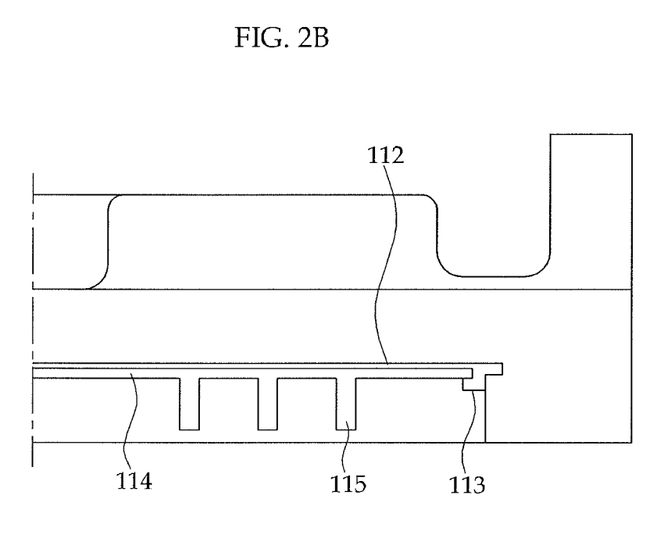

FIGS. 1A to 1D are combined perspective views illustrating an electronic control apparatus for a vehicle according to an exemplary embodiment of the present disclosure and FIGS. 2A and 2B are cross-sectional perspective views illustrating an electronic control apparatus for a vehicle according to an exemplary embodiment of the present disclosure.

As illustrated in FIG. 1A to 1D, an electronic control apparatus is a component which is mounted with an electronic control element which electronically controls each part of a vehicle, for example, an integrated control circuit unit such as an PCB 110 and requires a radiation structure which radiates heat generated from electronic components 111 located in a PCB 110 to the atmosphere and a housing structure which prevents moisture or a foreign substance from entering from the outside. The electronic control apparatus includes an overmold housing 100 which accommodates the PCB 110 therein and has an overmolding structure. A connector 120 is coupled to a front surface of the overmold housing 100.

The overmold housing 100 is overmolded so as to enclose the electronic control elements in order to prevent moisture or a foreign substance from entering from the outside. The overmold housing 100 includes electronic components section 101 which is overmolded so as to enclose the electronic components 111. The overmold housing 100 does not enclose the radiation plate 112 so as to discharge heat which is generated from the electronic components 111. The overmold housing 100 may be formed by molding only outer corners 102 of the radiation plate 112. Here, the radiation plate 112 has a slide fixing structure 113 which fixes the radiation board 114 when the radiation board 114 is slidably fitted. The slide fixing structure 113 has a fixing structure which is formed at both sides of the radiation plate 112 so as to fix the radiation board 114 when the radiation board 114 is fitted. The radiation board 114 is fitted into the slide fixing structure 113 to be detachable from one surface of the radiation plate 112.

The radiation board 114 includes at least one radiation pin 115 which is formed on one surface of the radiation board 114. Intervals between at least one radiation pin 115 or the number of radiation pins 115 may vary depending on additional radiation performance. For example, as illustrated in FIG. 1C, for the purpose of additional radiation performance, several radiation pins 115 are included only in another surface which is opposite to one surface of the PCB 110 on which the electronic components 111 is disposed and the radiation board 114 which does not have the radiation pins 115 may be fitted into the radiation plate 112 on another remaining surface. As illustrated in FIG. 1D, the radiation board 114 in which the radiation pins 115 are entirely formed regardless of one surface of the PCB 110 on which the electronic components 111 is disposed may be fitted into the radiation plate 112.

As illustrated in FIG. 1C, the radiation board 114 includes at least one radiation pin 115 which is formed on a part of a surface of the radiation slide. In contrast, as illustrated in FIG. 1D, the radiation board 114 includes at least one radiation pin 115 which is formed on the entire surface of the radiation slide.

As illustrated in FIGS. 2A and 2B, the electronic control apparatus for a vehicle according to an exemplary embodiment of the present disclosure includes an electronic control element including a PCB 110 and electronic components 111 of the PCB 110, a radiation plate 112, a connector 120, an overmold housing 100, a radiation board 114 including at least one radiation pin 115.

The electronic control element includes the PCB 110 which electrically controls each part of the vehicle and the electronic components 111 which is disposed on one surface of the PCB 110.

The radiation plate 112 is attached onto another surface which is opposite to one surface on which the electronic components 112 is located among the other surfaces of the PCB 110 to radiate heat of the electronic components 111 and has a slide fixing structure 113. For example, the radiation plate 112 is formed of a metal material or a pad type plate.

Here, the electronic components 111 may be located on a top side or a bottom side of the PCB 110. When the electronic components 111 is located on the top side of the PCB 110, the radiation plate 112 is attached onto the bottom side of the PCB 110. In contrast, when the electronic components 111 is located on the bottom side of the PCB 110, the radiation plate 112 is attached onto the top side of the PCB 110.

The connector 120 includes a connector pin 121 and is coupled to the electronic control element. The connector 120 is connected with the electronic control element through the connector pin 121. The connector pin 121 may have a plurality of pins for connection with the internal PCB 110 and a plurality of pins for connection with the outside. The connector 120 may be coupled to the electronic control element so as to be fitted therein. The connector 120 may be formed such that a leading edge and a trailing edge which are exposed to the outside are integrally formed.

The overmold housing 100 is configured to overmold the electronic control element onto which the radiation plate 112 is attached using a mold resin. In this case, the overmold housing 100 overmolds the remaining portion other than the other surface onto which the radiation plate 112 is attached among the other surfaces of the PCB 110 but a slidable (112) slide fixing structure 113 of the radiation plate is excluded to be overmolded.

In the radiation board 114, at least one radiation pin 115 is formed on one surface of the radiation board 114 and the radiation board 114 is slidably attached/detached onto/from the slide fixing structure of the radiation plate 112.

Outer corners 102 of the radiation plate 112 will be described with reference to details of FIGS. 2A and 2B. The overmold housing 100 overmolds a portion of the other surface of the PCB 110 other than the radiation plate 112 but molds so as to enclose the outer corner 102 of the radiation plate 112. This is because if the outer corner 102 of the radiation plate 112 is enclosed by the mold resin, the electronic control elements including the PCB 110 or the electronic components 111 will be protected from the entering moisture.

The radiation plate 112 has a slidable "U" shaped slide fixing structure 113 on the outer corner 102 of the radiation plate 112 so as to slidably fit the radiation board 114. The slidable "U" shaped slide fixing structure 113 may fix the radiation board 114 when the radiation board 114 is slidably fitted.

When an additional radiation structure is required other than the radiation using the radiation plate 112, the radiation board 114 may have various types of radiation pins 115 which conform with the additional radiation structure. For example, the radiation pins 115 may be formed and disposed in the radiation board 114 with a different shaped structure which conforms with the radiation performance, such as a dot type, a planar type, or an uneven type rather than a structure in which straight line shaped radiation pins 115 illustrated in FIGS. 2A and 2B are arranged in one line. The radiation board 114 may have at least one radiation pin 115 which conforms with an additional radiation structure on another surface which is opposite to one surface on which the electronic components 111 is located, among the other surfaces of the PCB 110.

In the meantime, the overmold housing 100 may be overmolded by a resin material which is injection-molded at below a predetermined temperature and a predetermined pressure. This is to prevent trouble of the electronic components 111 caused by high temperature or high pressure injection molding from occurring. The overmold housing 100 may be formed of a hardening plastic such as a thermosetting material. The overmold housing 100 may be formed of a plastic material having elasticity such as a thermoplastic elastomer material.

Figure 3:
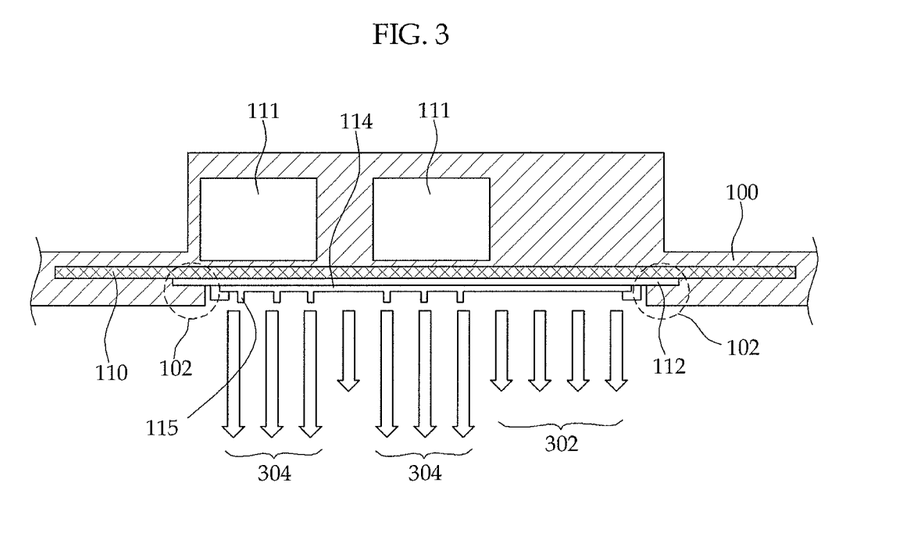
FIG. 3 is an explanatory view illustrating a structure which radiates heat generated from electronic components of the electronic control apparatus for a vehicle according to an exemplary embodiment of the present disclosure.

FIG. 3 is an explanatory view illustrating a structure which radiates heat generated from electronic components of the electronic control apparatus for a vehicle according to an exemplary embodiment of the present disclosure.

As illustrated in FIG. 3, the electronic components 111 is located on a top side of a PCB 110. A radiation plate 112 is attached onto a bottom side which is opposite to the portion on which the electronic components 111 is located. In the radiation board 114, at least one radiation pin 115 is formed on one surface of the radiation board 114 and the radiation board 114 is slidably fitted into the slide fixing structure 113 of the radiation plate 112.

The overmold housing 100 molds the electronic components 111 and the PCB 110 to enclose the electronic components 111 and the PCB 110. Therefore, the heat generated from the electronic components 111 is directly discharged to the atmosphere 302 through the radiation plate 112 and the radiation board 114 via the PCB 110.

In the meantime, radiation performance of a portion onto which the radiation pin 115 is attached and a portion onto which no radiation pin 115 is attached will be divided to be described below.

As illustrated in FIG. 3, the radiation performance 304 of the portion onto which the radiation pin 115 is attached is higher than the radiation performance 302 of the portion onto which no radiation pin 115 is attached. That is, when additional radiation performance is required depending on a location of the electronic components 111, more radiation may be performed through the portion on which the radiation pin 115 is formed. As described above, the electronic control apparatus has an excellent radiation effect by directly discharging heat to the atmosphere 302 through the radiation plate 112 and may easily increase additional radiation performance through the radiation board 114 on which the radiation pin 115 is formed.

The overmold housing 100 is molded from both ends of the bottom side of the PCB 110 to the outer corner 102 of the radiation plate 112. Here, the overmold housing 100 may be molded to have the same thickness from both ends of the bottom side of the PCB 110 to the outer corner 102 of the radiation plate 112.

In the meantime, the overmold housing 100 may be molded such that a thickness of a part of the outer corner 102 illustrated in FIG. 3 may be different from that of the outer corner 102 illustrated in FIG. 2A. The outer corner 102 illustrated in FIG. 3 will be described. The outer corner 102 of the radiation plate 112 which is attached to the PCB 110 may be molded to have a thickness which is smaller than that of a portion on which no radiation plate 112 is attached. That is, the overmold housing 100 may be molded at the outer corners 102 of the radiation plate 112 to be stepped.

FIGS. 4A to 4E are diagrams illustrating a manufacturing method of an electronic control apparatus for a vehicle according to an exemplary embodiment of the present disclosure.

Figure 4A:
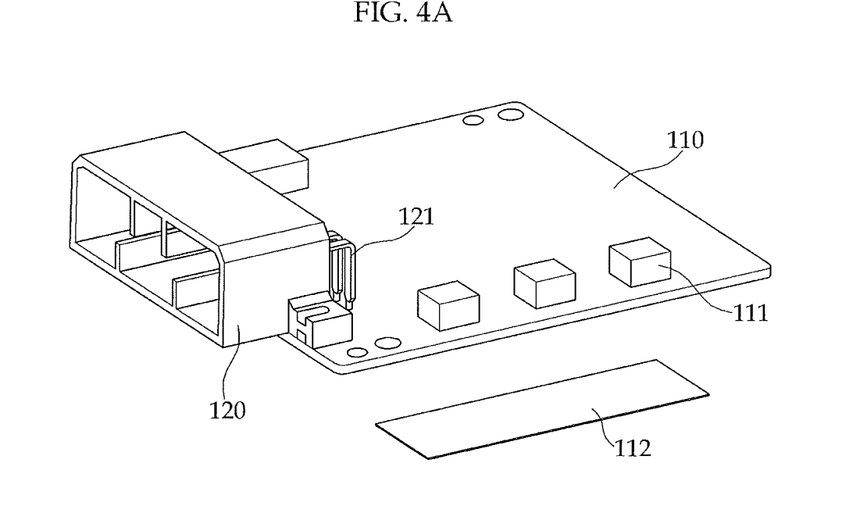
FIGS. 4A to 4E are diagrams illustrating a manufacturing method of an electronic control apparatus for a vehicle using a radiation board according to an exemplary embodiment of the present disclosure.
Figure 4B:
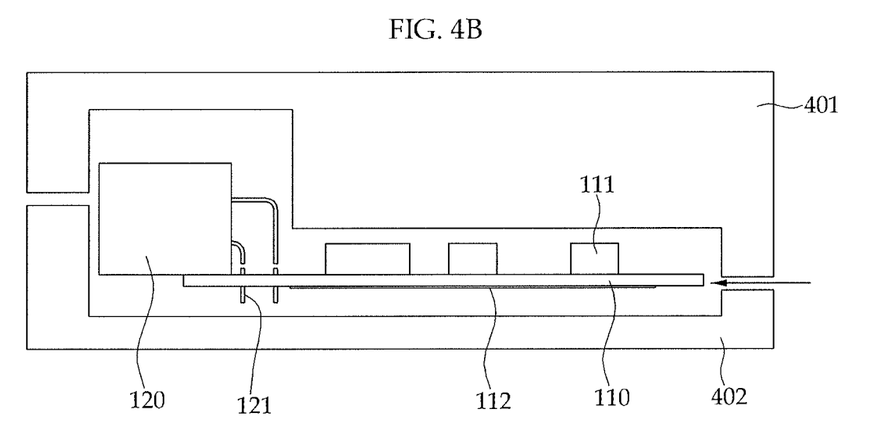
Figure 4C:
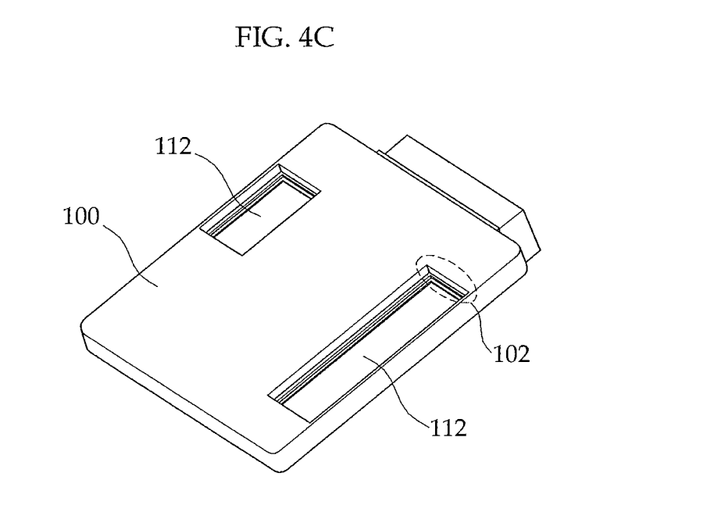

A manufacturing process of an electronic control apparatus for a vehicle may be performed in the order of FIGS. 4A to 4C.

As illustrated in FIG. 4A, in the manufacturing process of the electronic control apparatus, an electronic control element including a PCB 110 which electrically controls each part of the vehicle and electronic components which is disposed one surface of the PCB 110 is coupled to a connector 120 including a connector pin 121.

In the manufacturing process of the electronic control apparatus, a radiation plate 112 (for example, a metal material or radiation pad) is attached onto a bottom side of the PCB 110 which is opposite to the top side on which the electronic components 111 is located. The radiation plate 112 has a "U" shaped slide fixing structure on the outer corner of the radiation plate 112 so as to slidably fit the radiation board 114 therein. Here, when a plurality of heating elements 111 is provided on the PCB 110, the radiation plate 112 may be formed of a plate which has one radiation size and covers the plurality of heating elements 111. In this case, when the plurality of heating elements 111 maintains a minimum interval, the radiation plate 112 may be formed of a plate having one radiation size. When a plurality of heating elements 111 is provided on the PCB 110, the radiation plate 112 may be formed of a plurality of plates which corresponds to the plurality o heating elements 111, respectively.

Thereafter, as illustrated in FIG. 4B, in the manufacturing process of an electronic control apparatus, an electronic control element onto which the radiation plate 112 is attached is inserted into upper and lower molds 401 and 402. Here, the upper mold 401 may have a concave portion corresponding to a portion on which the electronic components 111 is located. The lower mold 402 has a structure in which the remaining portion other than a portion of the bottom side of the PCB 110 onto which the radiation plate 112 is attached is overmolded. That is, the lower mold 402 has a structure in which a mold resin is overmolded only to the outer corner except for a center portion of the radiation plate 112. The upper and lower molds 401 and 402 have a shape in which a part of the connector 120 is located outside the mold.

Next, in the manufacturing process of an electronic control apparatus, a mold resin is injected through an inlet between the upper and lower molds 401 and 402 for injection to overmold the electronic control element. In this case, in the manufacturing process of an electronic control apparatus, insides of the upper and lower molds 401 and 402 are maintained to be at below predetermined failure threshold temperature and pressure of the PCB 110 or the electronic components 111 and the electronic control element onto which the radiation plate 112 is attached is injection-molded.

As illustrated in FIG. 4C, in the manufacturing process of an electronic control apparatus, the upper and lower molds 401 and 402 are removed after overmolding the electronic control element. By doing this, the electronic control apparatus has electronic components part 101 in which a portion where the electronic components 111 is located is convex and a portion of the bottom side onto which the radiation plate 112 is attached is exposed to the outside. A molding process of the overmold housing 100 having a structure in which other portion than the plate surface of the radiation plate 112 is overmolded is completed.

Figure 4D:
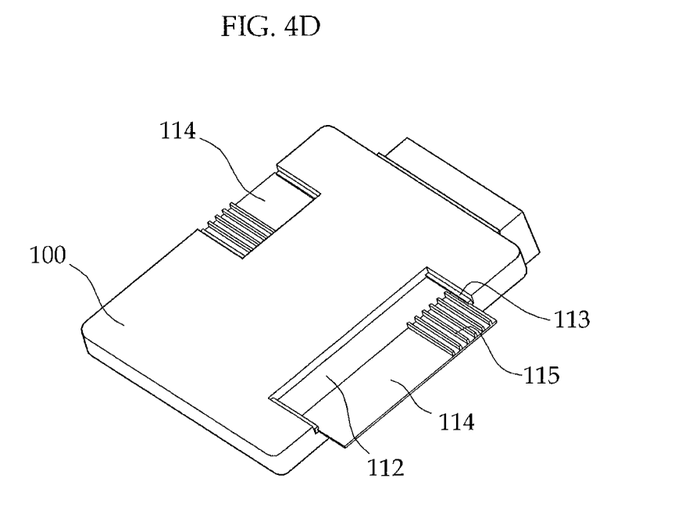
Figure 4E:
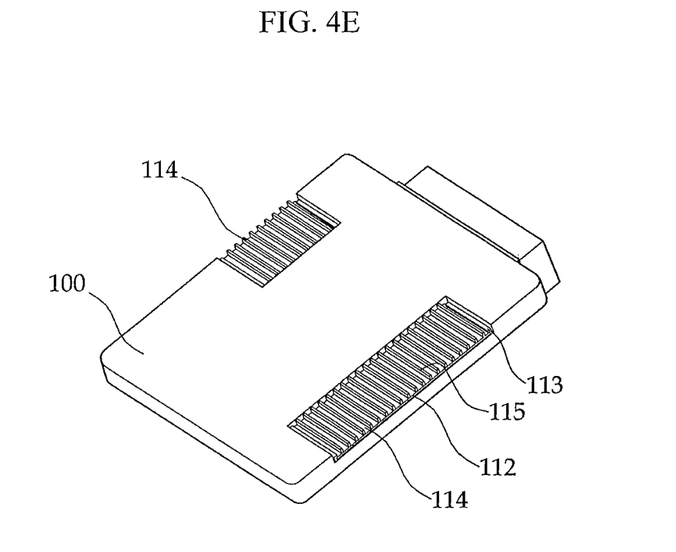

As illustrated in FIGS. 4D and 4F, in the manufacturing process of an electronic control apparatus, the radiation board 114 in which at least one radiation pin 115 is formed on one surface of the radiation board 114 is slidably attached onto the slide fixing structure 113 of the radiation plate 112. The radiation board 114 includes at least one radiation pin 115 which is formed on one surface of the radiation board 114.

When comparing the radiation pins 115 which are formed in the radiation board 114 illustrated in FIGS. 4D and 4E, the radiation pin 115 of the radiation board 114 illustrated in FIG. 4D is formed of a radiation pin having a different structure from the radiation pin 115 of the radiation board 114 illustrated in FIG. 4E, in order to improve radiation performance or radiate a heat only for a portion which requires addition radiation performance. In this case, intervals between at least one radiation pin 115 or the number of radiation pins 115 may vary depending on additional radiation performance.

According to the present disclosure, a radiation plate having a slide fixing structure (for example, "U" shaped) is attached onto a portion opposite to a portion which requires the radiation in an electronic control element and if additional radiation performance is required, a slidable radiation board which is detachable is attached/detached to directly emit heat to the atmosphere through the radiation plate and the radiation board to the atmosphere, thereby improving a radiation effect, and to implement a standard platform of the radiation structure and optimize a radiation structure through a slidable radiation board. In this point, since the present disclosure that is beyond the limit of the known art does not just utilize the related art but commercial or business possibility of applied equipment is sufficient and the present disclosure can be clearly implemented in practice, the present disclosure has industrial applicability.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electronic control apparatus for a vehicle, comprising:
   a printed circuit board (PCB) which includes an electronic control substrate which electrically controls multiple parts of a vehicle and electronic components installed on one surface of the electronic control substrate;
   a radiation plate which is attached onto another surface which is opposite to the one surface on which the electronic components is located among the other surfaces of the electronic control substrate in order to radiate heat of the electronic components and has a slide fixing structure;
   a radiation board which has at least one radiation pin formed on one surface thereof and is slidably attached/detached onto/from the slide fixing structure of the radiation plate;
   a connector which includes a connector pin and is coupled to the PCB; and
   an overmold housing which overmolds the PCB onto which the radiation plate is attached using a mold resin and overmolds the remaining portion other than another surface onto which the radiation plate is attached among the other surfaces of the electronic control substrate.

2. The electronic control apparatus for a vehicle of claim 1, wherein the radiation plate has an outer corner having a "U" shaped slide fixing structure so as to slidably fit the radiation board therein.

3. The electronic control apparatus for a vehicle of claim 1, wherein when an additional radiation structure is required other than the radiation using the radiation plate, the radiation board has various types of radiation pins according to the additional radiation structure.

4. The electronic control apparatus for a vehicle of claim 1, wherein the radiation board includes at least one radiation pin having an interval between radiation pins or the number of radiation pins according to the additional radiation structure on another surface which is opposite to the one surface on which the electronic components is located, among the other surfaces of the electronic control substrate.

5. The electronic control apparatus for a vehicle of claim 1, wherein the overmold housing overmolds a portion other than the radiation plate among the other surfaces of the PCB and encloses an outer corner of the radiation plate except for the slide fixing structure of the radiation plate.

6. The electronic control apparatus for a vehicle of claim 1, wherein the radiation plate is a metal material or a pad type plate.

7. The electronic control apparatus for a vehicle of claim 1, wherein the overmold housing is injection-molded while being maintained at below predetermined failure threshold temperature and pressure of the electronic control substrate or the electronic components.

8. A manufacturing method of an electronic control apparatus, comprising:
   coupling a printed circuit board (PCB) which includes an electronic control substrate which electrically controls multiple parts of a vehicle and electronic components installed on a surface of the electronic control substrate with a connector which includes a connector pin;
   attaching a radiation plate having a slide fixing structure onto another surface which is opposite to the one surface on which the electronic components is located among the other surfaces of the electronic control substrate;
   overmolding by inserting the PCB onto which the radiation plate is attached in upper and lower molds in which the remaining portion other than another surface on which the radiation plate is attached, is overmolded among the other surfaces of the electronic control substrate and injecting the mold resin therein; and
   attaching and/or detaching slidably the radiation board which has at least one radiation pin formed on one surface thereof onto and/or from the slide fixing structure of the radiation plate.

9. The manufacturing method of an electronic control apparatus of claim 8, wherein in the attaching/detaching, when the slide fixing structure of the radiation plate has a "U" shape, the radiation board is slidably attached and/or detached onto the "U" shaped slide fixing structure.

10. The manufacturing method of an electronic control apparatus of claim 8, wherein in the overmolding, a portion other than the radiation plate among the other surfaces of the electronic control substrate is overmolded by injecting the mold resin so as to encloses an outer corner of the radiation plate except for the slide fixing structure of the radiation plate.

11. The manufacturing method of an electronic control apparatus of claim 8, wherein in the overmolding, the PCB onto which the radiation plate is attached is injection-molded while maintaining the inside of the mold to be at below predetermined failure threshold temperature and pressure of the electronic control substrate or the electronic components.

* * * * *